(12) United States Patent
Sano et al.

(10) Patent No.: US 10,707,809 B2
(45) Date of Patent: Jul. 7, 2020

(54) GROUND FAULT DETECTION DEVICE

(71) Applicant: OMRON Corporation, Kyoto (JP)

(72) Inventors: Akihiko Sano, Uji (JP); Kotaro Nakamura, Kusatsu (JP); Kenji Kobayashi, Moriyama (JP); Kohei Nakagawa, Kusatsu (JP); Makoto Ide, Koka (JP)

(73) Assignee: OMRON Corporation, Kyoto (JP)

(*) Notice: Subject to any disclaimer, the term of this patent is extended or adjusted under 35 U.S.C. 154(b) by 72 days.

(21) Appl. No.: 16/133,679

(22) Filed: Sep. 17, 2018

(65) Prior Publication Data

US 2019/0131925 A1  May 2, 2019

(30) Foreign Application Priority Data

Oct. 30, 2017  (JP) ................. 2017-209634

(51) Int. Cl.
| | |
|---|---|
| *H02S 50/10* | (2014.01) |
| *H02S 40/32* | (2014.01) |
| *G01R 31/50* | (2020.01) |

(52) U.S. Cl.
CPC .............. *H02S 50/10* (2014.12); *G01R 31/50* (2020.01); *H02S 40/32* (2014.12)

(58) Field of Classification Search
CPC .......... H02S 50/10; H02S 40/32; G01R 31/50
USPC ...................................................... 324/509
See application file for complete search history.

(56) References Cited

U.S. PATENT DOCUMENTS

| 6,812,396 B2 * | 11/2004 | Makita ................. H01L 31/048 136/244 |
| 6,927,955 B2 * | 8/2005 | Suzui .................... H02H 3/337 361/42 |
| 8,467,160 B2 * | 6/2013 | West ..................... H02M 7/44 361/42 |
| 8,502,416 B2 * | 8/2013 | Falk ....................... H02J 3/383 307/77 |
| 8,563,847 B2 * | 10/2013 | Meyer .................... H02S 40/38 136/244 |
| 8,587,906 B2 * | 11/2013 | Bhavaraju ............. H02J 3/383 361/42 |

(Continued)

FOREIGN PATENT DOCUMENTS

| CN | 103229063 | 7/2013 |
| CN | 103282786 | 9/2013 |

(Continued)

OTHER PUBLICATIONS

"Office Action of Taiwan Counterpart Application," with machine English translation thereof, dated May 23, 2019, p. 1-p. 6.

*Primary Examiner* — Patrick Assouad
*Assistant Examiner* — Sean Curtis
(74) *Attorney, Agent, or Firm* — JCIPRNET

(57) ABSTRACT

The disclosure is provided to improve the accuracy of a ground fault position detected from a power conditioning system. A ground fault position calculation part (41) calculates a ground fault position ($P_g$) by using a power supply voltage of a solar cell string (11), a ground fault current ($I_g$), and a ground potential of an input terminal (N) measured by a power conditioning system (12). The ground fault position calculation part (41) sets a lower limit value of the power supply voltage to be used.

6 Claims, 7 Drawing Sheets

(56) References Cited

U.S. PATENT DOCUMENTS

| | | | | |
|---|---|---|---|---|
| 8,760,826 | B2* | 6/2014 | West | H02H 3/16 361/42 |
| 8,773,156 | B2* | 7/2014 | Takada | H02S 50/10 323/906 |
| 9,024,640 | B2* | 5/2015 | Liu | G01R 31/50 324/510 |
| 9,057,752 | B2* | 6/2015 | Luebke | H02S 50/10 |
| 9,103,865 | B2* | 8/2015 | Agamy | H02H 3/33 |
| 9,176,201 | B2* | 11/2015 | Ishii | G01R 31/025 |
| 9,244,117 | B2* | 1/2016 | Furse | G01R 31/2841 |
| 9,366,714 | B2* | 6/2016 | Ledenev | G01R 31/50 |
| 9,465,909 | B2* | 10/2016 | Kawate | G01R 31/40 |
| 9,476,932 | B2* | 10/2016 | Furse | G01R 31/2841 |
| 9,494,657 | B2* | 11/2016 | Khan | G01R 31/40 |
| 9,502,885 | B2* | 11/2016 | Martin | H02S 50/10 |
| 9,543,890 | B2* | 1/2017 | Meyer | H01L 31/049 |
| 9,634,479 | B2* | 4/2017 | Kang | H02S 50/10 |
| 9,897,642 | B1* | 2/2018 | Johnson | H01L 31/02021 |
| 9,970,977 | B2* | 5/2018 | Furse | G01R 31/2841 |
| 2003/0067723 | A1* | 4/2003 | Suzui | H02H 3/337 361/42 |
| 2003/0075211 | A1* | 4/2003 | Makita | H01L 31/048 136/244 |
| 2006/0237057 | A1* | 10/2006 | Buij | H02H 3/16 136/244 |
| 2010/0110742 | A1* | 5/2010 | West | H02H 7/20 363/132 |
| 2010/0282293 | A1* | 11/2010 | Meyer | H01L 31/049 136/244 |
| 2011/0031813 | A1* | 2/2011 | Falk | H02J 3/383 307/77 |
| 2012/0026631 | A1* | 2/2012 | Kazemi | H02H 7/20 361/42 |
| 2012/0053867 | A1* | 3/2012 | Dunn | H02S 50/10 702/58 |
| 2012/0223734 | A1* | 9/2012 | Takada | H02S 50/10 324/761.01 |
| 2013/0009662 | A1* | 1/2013 | Komano | H02S 40/34 324/761.01 |
| 2013/0015875 | A1* | 1/2013 | Kumar | H02S 50/10 324/761.01 |
| 2013/0194706 | A1* | 8/2013 | Har-Shai | H02H 1/0015 361/42 |
| 2013/0223113 | A1* | 8/2013 | West | H02H 3/16 363/55 |
| 2013/0249297 | A1* | 9/2013 | Takehara | H02J 1/00 307/71 |
| 2013/0264883 | A1* | 10/2013 | Bhavaraju | H01L 31/02021 307/80 |
| 2013/0285670 | A1* | 10/2013 | Yoshidomi | G01R 31/50 324/510 |
| 2013/0307556 | A1* | 11/2013 | Ledenev | G01R 31/50 324/509 |
| 2014/0012520 | A1* | 1/2014 | Zhao | H02H 3/042 702/58 |
| 2014/0035373 | A1* | 2/2014 | Meyer | H01L 31/0504 307/52 |
| 2014/0070815 | A1* | 3/2014 | Liu | G01R 31/50 324/510 |
| 2014/0070833 | A1* | 3/2014 | Luebke | H02S 50/10 324/754.21 |
| 2014/0103937 | A1* | 4/2014 | Khan | H02S 50/10 324/509 |
| 2014/0142873 | A1* | 5/2014 | Kawate | G01R 31/1227 702/58 |
| 2014/0142874 | A1* | 5/2014 | Martin | H02H 1/0015 702/58 |
| 2014/0176151 | A1* | 6/2014 | Agamy | H02S 50/10 324/509 |
| 2014/0195177 | A1* | 7/2014 | Kang | H02H 1/0015 702/58 |
| 2014/0225444 | A1* | 8/2014 | Yoshidomi | H02H 3/16 307/78 |
| 2014/0239968 | A1* | 8/2014 | Ishii | H02S 50/00 324/509 |
| 2014/0253138 | A1* | 9/2014 | Ishii | H02S 50/10 324/509 |
| 2014/0266238 | A1* | 9/2014 | Furse | G01R 31/11 324/533 |
| 2015/0188487 | A1* | 7/2015 | Yoshidomi | H02S 50/10 324/761.01 |
| 2016/0169957 | A1* | 6/2016 | Furse | G01R 31/2841 324/533 |
| 2016/0336899 | A1* | 11/2016 | Ledenev | H02S 50/10 |
| 2017/0030960 | A1* | 2/2017 | Furse | G01R 31/11 |
| 2017/0085094 | A1* | 3/2017 | Meyer | H01L 31/049 |
| 2017/0279402 | A1* | 9/2017 | Schmaelzle | H01L 31/0488 |
| 2017/0317500 | A1* | 11/2017 | Kumar | H02H 7/122 |
| 2018/0041164 | A1* | 2/2018 | Sano | H02S 50/10 |
| 2018/0191293 | A1* | 7/2018 | Falk | H02S 40/34 |
| 2018/0233902 | A1* | 8/2018 | Sano | H02S 50/00 |
| 2019/0131925 | A1* | 5/2019 | Sano | G01R 31/50 |
| 2019/0181800 | A1* | 6/2019 | Nesemann | H02S 50/10 |
| 2019/0393834 | A1* | 12/2019 | Har-Shai | H02H 1/0015 |

FOREIGN PATENT DOCUMENTS

| | | | |
|---|---|---|---|
| CN | 103607172 | | 2/2014 |
| JP | 2001275259 | | 10/2001 |
| JP | 2016050783 | | 4/2016 |
| JP | 2016103916 | A * | 6/2016 |
| JP | 2016103917 | A * | 6/2016 |
| TW | 201534048 | | 9/2015 |

* cited by examiner

GROUND FAULT DETECTION DEVICE

CROSS-REFERENCE TO RELATED APPLICATION

This application claims the priority benefit of Japan application serial no. 2017-209634, filed on Oct. 30, 2017. The entirety of the above-mentioned patent application is hereby incorporated by reference herein and made a part of this specification.

BACKGROUND

Technical Field

The disclosure relates to a ground fault detection device applied to a solar power generation system including a solar cell string.

Description of Related Art

The solar power generation system has a solar cell string in which a plurality of solar cell modules are connected in series. Each solar cell module has a plurality of solar cells connected in series. In the solar cell string above, a DC power generated by the solar cell string is converted into an appropriate DC power and/or an appropriate AC power by a power conditioning system (PCS).

The electrical path of the solar cell string is electrically insulated (hereinafter simply referred to as "insulated") with any sealing material. However, for some reason, when the insulation resistance between a certain position in the electrical path of the solar cell string and the ground decreases, a ground fault occurs at the position. In view of this, a solar power generation system is conventionally provided with a ground fault detection device for detecting a ground fault as disclosed in Patent Document 1 (Japanese Laid-open No. 2001-275259) and Patent Document 2 (Japanese Laid-open No. 2016-050783).

As a type of PCS, the system interconnection inverter of Patent Document 1 converts a DC power input from a DC power supply into an AC power via a converter circuit and an inverter circuit in which input and output are not insulated and outputs the AC power to a grounded system. The system interconnection inverter includes a ground fault detection means for detecting a ground fault of the DC power supply. In particular, the ground fault detection means detects a DC component of a difference current between a current on the positive side line and a current on the negative side line on the input side and determines the ground fault according to whether the detected value is not less than a predetermined level.

The system interconnection inverter detects an input voltage from the DC power supply at the time of detecting the ground fault. Then, with respect to two of the predetermined level above, two of the input voltage above at the time of detecting the ground fault are respectively detected, so as to detect the ground fault resistance and the ground fault position.

The ground fault detection device as described in Patent Document 2 opens the negative electrode of the solar cell string and grounds the positive electrode through a detection resistor, and at this time, the voltage generated across the detection resistor is detected as a first voltage. Similarly, while the positive electrode of the solar cell string is opened, the negative electrode is grounded through the detection resistor, and at this time, the voltage generated across the detection resistor is detected as a second voltage. Further, the inter-electrode voltage between the positive electrode and the negative electrode of the solar cell string is detected.

Next, the ground fault detection device obtains the ground fault resistance value (insulation resistance value) of the solar cell string based on the first voltage, the second voltage, the inter-electrode voltage, and the resistance value of the detection resistor. Based on the ground fault resistance value, the presence or absence of a ground fault is detected. Also, the ground fault position is detected based on the ratio of the first voltage and the second voltage.

SUMMARY

In some cases, the ground fault occurs irregularly (hereinafter referred to as an "irregular ground fault"), such as a ground fault that occurs only in the morning, a ground fault that occurs only when humidity is high, and the like. When such an irregular ground fault occurs, the irregular ground fault has sometimes settled by the time a worker arrives. On the other hand, as in the system interconnection inverter described in Patent Document 1, the irregular ground fault can also be detected in the case where the ground fault is detected by the PCS.

Also, as in the system interconnection inverter described in Patent Document 1, in the case where the ground fault position is detected by using the measured value from a measurement circuit already existing in the PCS, the scale of the device can be reduced as compared to the case where the ground fault detection device described in Patent Document 2 is incorporated in the PCS.

However, as confirmed by the inventors of the disclosure, the ground fault position detected by using the measured value from the measurement circuit already existing in the PCS may deviate considerably from the position where the ground fault actually occurs.

The embodiments of the disclosure are provided to improve the accuracy of a ground fault position detected from a PCS.

A ground fault detection device of an embodiment of the disclosure is adapted for a solar power generation system, and the ground fault detection device includes a solar cell string in which a plurality of solar cell modules are connected in series; and a power conversion device for converting power supplied from the solar cell string and outputting the converted power to a system; the ground fault detection device includes a ground fault position specifying part for specifying a ground fault position by using an output voltage of the solar cell string, a ground fault current, and a ground potential measured by the power conversion device.

In the ideal case, the output voltage and the ground fault current have linearity, and the ground fault position can be estimated based on the relationship between the output voltage and the ground fault current.

However, as a result of actual confirmation by the inventors of the disclosure, it was found that an error was included in the estimated ground fault position. It is considered that this is because the voltage of the solar cell modules located on the negative electrode terminal side of the solar cell string with respect to the ground fault position differs from the voltage of the solar cell modules located on the positive electrode terminal side of the solar cell string with respect to the ground fault position depending on the ground fault current.

As a result of further study by the inventors of the disclosure, it was found based on the I-V characteristic (current-voltage characteristic) of the solar cell string that the error becomes small in the region where the output voltage is high.

Therefore, in the ground fault detection device, the ground fault position specifying part sets a lower limit value of the output voltage to be used.

According to the configuration above, since the output voltage equal to or lower than the lower limit value is used, it is possible to suppress the error of the ground fault position, and as a result, the accuracy of the ground fault position can be improved. If the ground potential at one of the positive electrode terminal and the negative electrode terminal of the solar cell string can be obtained, the ground potential measured based on arbitrary grounding such as grounding of the system, negative electrode grounding of an insulation transformer provided in the power conversion device, and the like can be used for specifying the ground fault position.

The lower limit value may be a value obtained by multiplying an open circuit voltage of the solar cell string by a predetermined ratio. In this case, since the open state can be easily measured, the lower limit value can be easily set.

Also, the lower limit value may be the output voltage at a maximum output point of the solar cell string. In this case, the output voltage at the time when the ground fault is detected may be set as the lower limit value, and the lower limit value can be easily set.

The lower limit value may be a minimum value in a range in which linearity of the output voltage and the ground fault current is maintained.

A ground fault detection device of another embodiment of the disclosure is adapted for a solar power generation system, and the solar power generation system includes a solar cell string in which a plurality of solar cell modules are connected in series; and a power conversion device for converting power supplied from the solar cell string and outputting the converted power to a system; the ground fault detection device includes a ground fault position specifying part for specifying a ground fault position by using an output voltage of the solar cell string, a ground fault current, and a ground potential measured by the power conversion device. The ground fault position specifying part outputs information on a range of an error of the ground fault position corresponding to the specified ground fault position.

Here, examples of the information include a ratio of the length from the negative electrode terminal of the solar cell string to the ground fault position to the length of the solar cell string, the information on the solar cell module included in the error, and the like. Examples of the output include display, printing, communication, and the like.

According to the configuration above, the user can grasp the rough position where the ground fault occurs by recognizing the range of the error of the ground fault position. As a result, it is possible to reduce the risk of mistaking the solar cell module to be repaired or causing electric shock resulting from accidentally touching the solar cell module which is grounded.

As a result of further confirmation by the inventors, it was found that the output voltage, the ground fault current, and the ground fault position (with the error considered) can be associated with each other based on the I-V characteristic.

A ground fault detection device of another embodiment of the disclosure is adapted for a solar power generation system, and the solar power generation system includes a solar cell string in which a plurality of solar cell modules are connected in series; and a power conversion device for converting power supplied from the solar cell string and outputting the converted power to a system; the ground fault detection device includes a ground fault position specifying part for specifying a ground fault position by using an output voltage of the solar cell string, a ground fault current, and a ground potential measured by the power conversion device. The ground fault position specifying part obtains an I-V characteristic of the solar cell string from the power conversion device, creates corresponding information of the output voltage and the ground fault current for the ground fault position by using the obtained I-V characteristic, and specifies the ground fault position corresponding to the output voltage and the ground fault current obtained from the power conversion device based on the created corresponding information.

According to the configuration above, the specified ground fault position is one in which the error is taken into account. Therefore, the ground fault position can be specified accurately.

According to the embodiments of the disclosure, it is possible to improve the accuracy of the ground fault position detected from the PCS.

DESCRIPTION OF THE EMBODIMENTS

Figure 1:
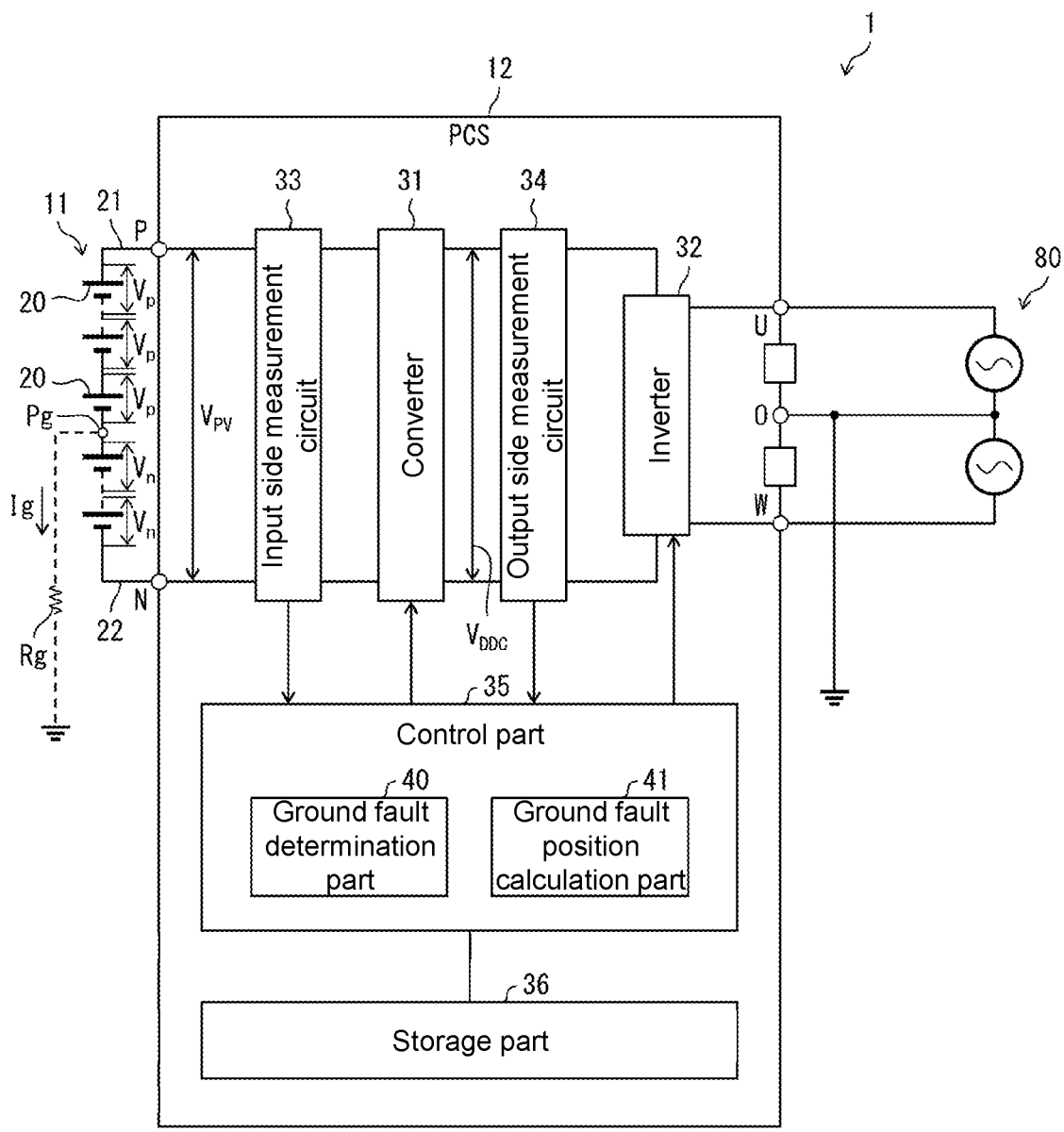
FIG. 1 is a schematic circuit diagram showing an example of an applied case of a solar power generation system according to an embodiment of the disclosure.

Hereinafter, embodiments of the disclosure will be described in detail. For convenience of description, elements having the same functions as those shown in respective embodiments are denoted by the same reference numerals, and description thereof is omitted as appropriate.

Embodiment 1

First, with reference to FIG. 1, an example of a case to which the disclosure is applied will be described. FIG. 1 is a schematic circuit diagram showing an example of an applied case of a solar power generation system according to the present embodiment. As shown in FIG. 1, a solar power generation system 1 is provided with a solar cell string 11 and a PCS 12 (a power conversion device).

The solar cell string 11 is formed by connecting a plurality (plural) of solar cell modules 20 in series. The solar cell string 11 is connected to input terminals P/N of the PCS 12 via electric paths 21 and 22, respectively. The solar cell module 20 includes a plurality of solar battery cells (not shown) connected in series and is formed in a panel shape. The light energy from the sun and the like is converted into DC electric energy in the plurality of solar battery cells, superimposed in the solar cell module 20 and further superimposed in the solar cell string 11, and is supplied to the PCS 12.

The PCS 12 converts the DC power input from the solar cell string 11 via the input terminals P/N into a predetermined AC power and outputs the AC power to an external power system 80. Specifically, the PCS 12 includes a converter 31 and an inverter 32.

The converter 31 is a circuit that converts the DC power from the solar cell string 11 into a predetermined DC power (DC/DC conversion) and is, for example, a step-up chopper. The DC power converted by the converter 31 is supplied to the inverter 32.

The inverter 32 is a circuit that performs a conversion operation (DC/AC conversion) for converting the DC power supplied from the converter 31 into a predetermined AC power (for example, of a frequency of 60 Hz). The AC power converted by the inverter 32 is supplied to the external power system 80. The inverter 32 also controls the ground potential of the power system 80 to be constant. In the example of FIG. 1, the power system 80 is a single-phase three-wire system, and the neutral point is grounded. It is noted that the power system 80 of another power distribution type, such as a single-phase two-wire type, a three-phase three-wire type, a three-phase four-wire system, and the like, may be used.

In this way, by providing the PCS 12, it is possible to convert the DC power generated by the solar cell string 11 into an AC power having predetermined voltage and frequency that enable system interconnection with the power system 80.

In the present embodiment, the PCS 12 further includes an input side measurement circuit 33, an output side measurement circuit 34, a control part 35 (a ground fault detection device), and a storage part 36.

The input side measurement circuit 33 measures the voltage and the current on the input side of the converter 31. More specifically, the input side measurement circuit 33 measures the voltage between the input terminals P/N, i.e., a power supply voltage $V_{PV}$ (an output voltage) of the solar cell string 11. Further, the input side measurement circuit 33 measures a current $I_p$ flowing from the solar cell string 11 via the input terminal P to the converter 31 and a current $I_n$ flowing from the converter 31 to the solar cell string 11 via the input terminal N. The input side measurement circuit 33 transmits the measured data to the control part 35.

The output side measurement circuit 34 measures the voltage on the output side of the converter 31, i.e., a converted voltage $V_{DDC}$ converted by the converter 31. The output side measurement circuit 34 transmits the measured data to the control part 35.

The control part 35 comprehensively controls the operations of the various components in the PCS 12, and is, for example, constituted by a computer including a CPU (central processing unit) and a memory. Control of the operations of the various components is performed by causing the computer to execute control programs. The storage part 36 records information and is constituted by a recording device such as a hard disk, a flash memory, and the like.

The control part 35 includes a ground fault determination part 40 and a ground fault position calculation part 41 (a ground fault position specifying part). The ground fault determination part 40 determines the presence or absence of a ground fault. The current $I_p$ from the input terminal P to the converter 31 and the current $I_n$ from the converter 31 to the input terminal N are of the same size in the normal case, but when a ground fault occurs, the size becomes different.

Therefore, in the present embodiment, the ground fault determination part 40 calculates a differential current $\Delta I$ between the current $I_p$ and the current $I_n$ measured by the input side measurement circuit 33, and if the differential current $\Delta I$ is equal to or greater than a predetermined value, the ground fault determination part 40 determines that a ground fault has occurred (or a ground fault exists). The differential current $\Delta I$ at this time is a ground fault current $I_g$. By using a zero-phase current transformer (ZCT) in the input side measurement circuit 33, the differential current $\Delta I$ can be directly measured. Further, in the present embodiment, the ground fault current $I_g$ is detected by the input side measurement circuit 33, but the disclosure is not limited thereto. The ground fault current $I_g$ may be detected by the output side measurement circuit 34 or may be detected based on the output current of the inverter 32.

The ground fault position calculation part 41 calculates a ground fault position $P_g$, which is a position where a ground fault occurs. The ground fault position $P_g$ is calculated by the following method. Calculated by using the ground fault current $I_g$ and a ground fault resistance $R_g$, a ground potential (hereinafter referred to as a "ground fault potential") $V_g$ of the ground fault position $P_g$ is $V_g = I_g \times R_g$.

On the other hand, the ground potential at the input terminal N is $-\frac{1}{2} \times V_{DDC}$, as the neutral point of the power system 80 is grounded. Calculated by using the power supply voltage $V_{PV}$, a voltage (a ground fault point voltage) between the input terminal N and the ground fault position $P_g$ is represented by $V_{PV} \times X$ (where $0 \leq X \leq 1$). Therefore, the ground fault potential $V_g$ is $V_g = (-\frac{1}{2} \times V_{DDC}) + (V_{PV} \times X)$.

Here, X is a value indicating the ground fault position $P_g$. $X=0$ at the negative electrode terminal of the solar cell string 11 connected to the input terminal N, and $X=1$ at the positive electrode terminal of the solar cell string 11 connected to the input terminal P. Further, it is assumed that the number of the solar cell modules 20 included in the solar cell string 11 is n (where $2 \leq n$, and n is a natural number) and the ground fault position $P_g$ is between the $k^{th}$ (where $1 \leq k \leq n-1$) and $(k+1)^{th}$ solar cell modules 20 from the input terminal N, and $X = k/n$.

From the above, Equation (1) below is derived.

$$I_g \times R_g = (-\frac{1}{2} \times V_{DDC}) + (V_{PV} \times X) \qquad (1)$$

Therefore, by measuring the power supply voltage $V_{PV}$ and the converted voltage $V_{DDC}$ when the ground fault current $I_g$ becomes zero, X indicating the ground fault position $P_g$ can be obtained. Alternatively, by measuring a plurality of sets of the ground fault current $I_g$, the power supply voltage $V_{PV}$, and the converted voltage $V_{DDC}$ by changing the power supply voltage $V_{PV}$, X indicating the ground fault position $P_g$ and the ground fault resistance $R_g$ can be obtained.

However, as confirmed by the inventors of the disclosure, the ground fault current $I_g$ and the ground fault point voltage ($V_{PV} \times X$) at the actual ground fault position $P_g$ may deviate from the ground fault current $I_g$ and the ground fault point voltage ($V_{PV} \times X$) determined based on Equation (1) above.

Figure 2A:
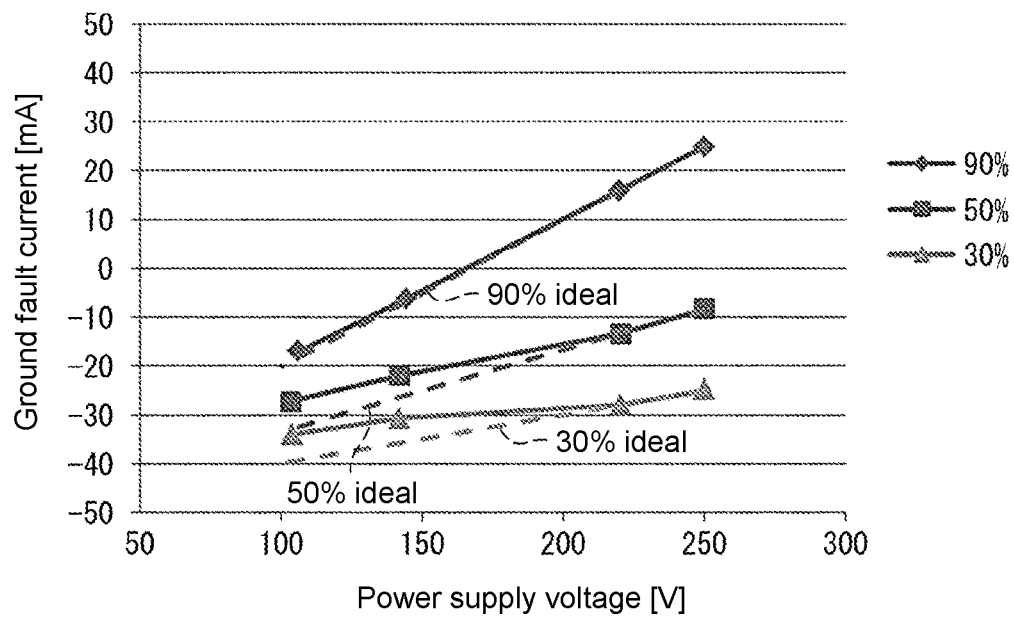
FIG. 2A and FIG. 2B are graphs showing an example of ideal measured values and actual measured values at the time when a ground fault occurs at each ground fault position in a case where a ground fault resistance is 3 kΩ in the solar power generation system.
Figure 2B:
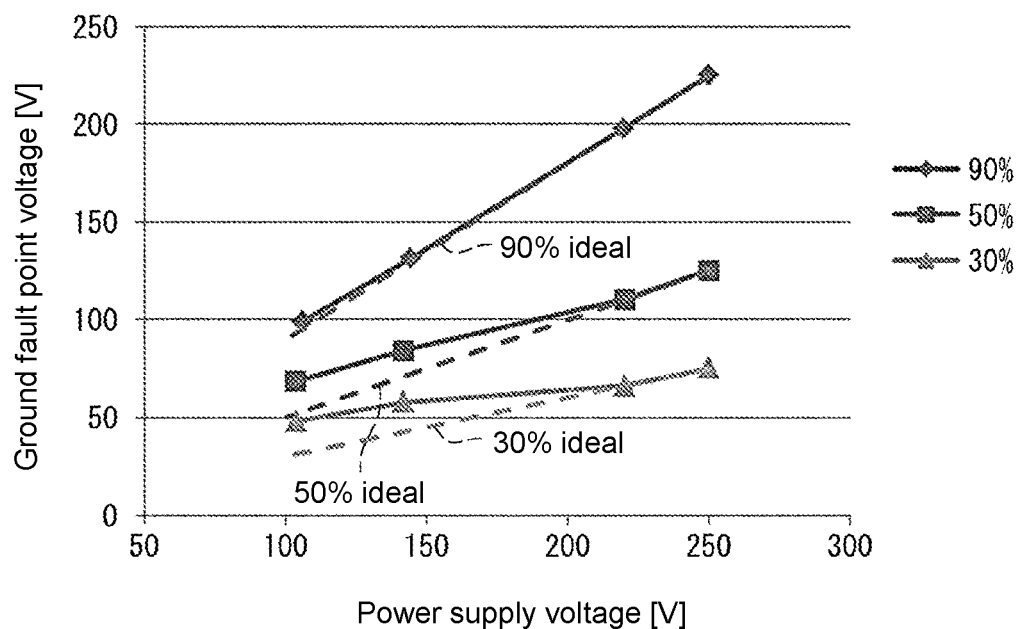
Figure 3A:
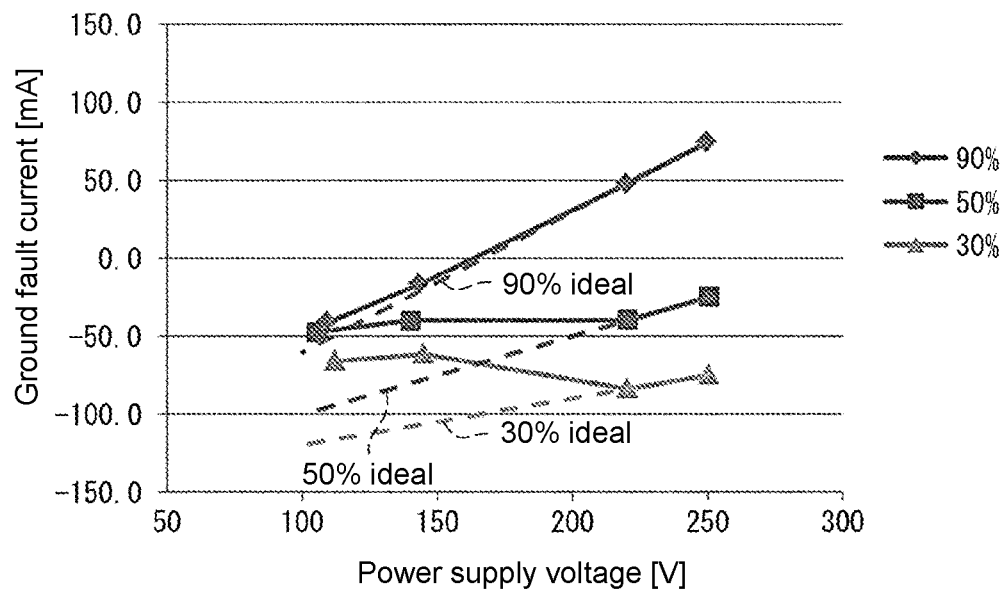
FIG. 3A and FIG. 3B are graphs showing another example of ideal measured values and actual measured values at the time when a ground fault occurs at each ground fault position in a case where the ground fault resistance is 1 kΩ in the solar power generation system.
Figure 3B:
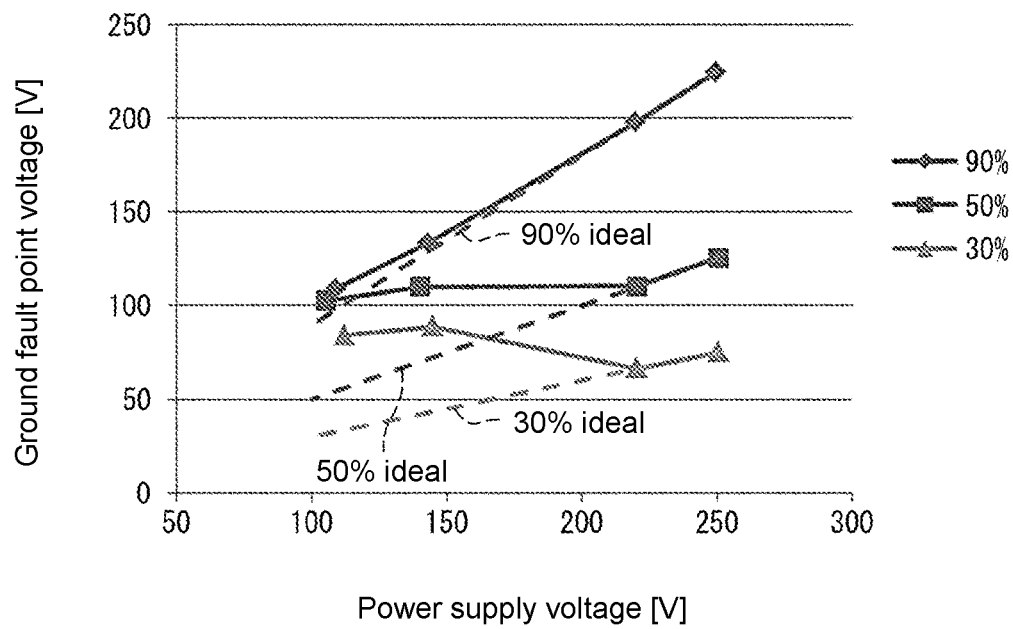

FIG. 2A, FIG. 2B, FIG. 3A and FIG. 3B are graphs showing examples of ideal measured values (ideal values) calculated based on Equation (1) above and actually measured values (actual measured value) at the time when a ground fault occurs at each ground fault position $P_g$ in the solar power generation system 1 of the present embodiment. FIG. 2A and FIG. 2B show a case where the ground fault resistance $R_g$ is 3 kΩ, and FIG. 3A and FIG. 3B show a case where the ground fault resistance $R_g$ is 1 kΩ. FIG. 2A and FIG. 3A are graphs showing the relationship between the power supply voltage $V_{PV}$ and the ground fault current $I_g$, and FIG. 2B and FIG. 3B are graphs showing the relationship between the power supply voltage $V_{PV}$ and the ground fault point voltage ($V_{PV} \times X$).

In FIG. 2A, FIG. 2B, FIG. 3A and FIG. 3B, the actual measured value is indicated by a solid line, and the ideal value is indicated by a broken line. Also, "90%", "50%", and "30%" in FIG. 2A, FIG. 2B, FIG. 3A and FIG. 3B are values of X indicating the ground fault position $P_g$.

Referring to FIG. 2A, FIG. 2B, FIG. 3A and FIG. 3B, it can be understood that the error of the actual measured values of the ground fault current $I_g$ and the ground fault point voltage ($V_{PV} \times X$) with respect to the ideal values increases as the power supply voltage $V_{PV}$ decreases. Further, it can be understood that the smaller the ground fault resistance $R_g$ is, the larger the error becomes.

Figure 4:
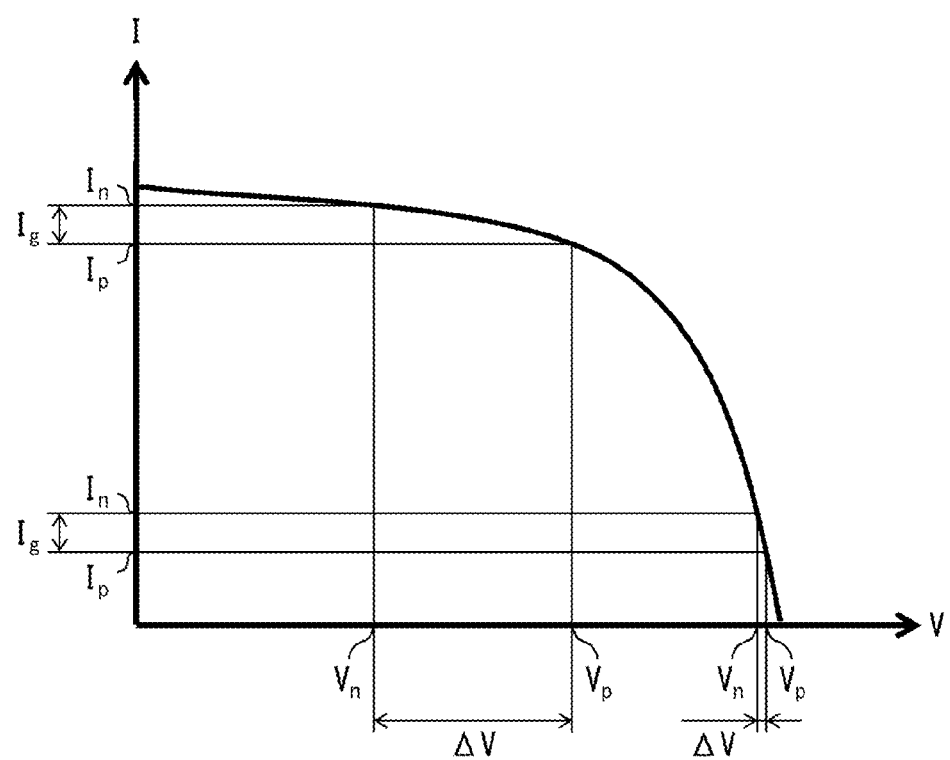
FIG. 4 is a graph showing an example of an I-V characteristic of each of solar cell modules that constitute a solar cell string in the solar power generation system.

With reference to FIG. 1 and FIG. 4, the cause of the phenomenon as shown in FIG. 2A, FIG. 2B, FIG. 3A and FIG. 3B will be examined. FIG. 4 is a graph showing an example of the I-V characteristic of each of the solar cell modules 20 that constitute the solar cell string 11. The I-V characteristic of the solar cell string 11 is also the same graph as in FIG. 4.

$V_n$ and $V_p$ shown in FIG. 4 are the same as $V_n$ and $V_p$ shown in FIG. 1. As shown in FIG. 1, $V_n$ above indicates the output voltage of the solar cell module 20 on the side of the input terminal N (N side) with respect to the ground fault position $P_g$. On the other hand, $V_p$ above indicates the output voltage of the solar cell module 20 on the side of the input terminal P (P side) with respect to the ground fault position $P_g$.

Referring to FIG. 1 and FIG. 4, the output current $I_p$ of the P-side solar cell module 20 is lower than the output current $I_n$ of the N-side solar cell module 20 by the ground fault current $I_g$. Thus, it can be understood that the output voltage $V_p$ of the P-side solar cell module 20 is higher than the output voltage $V_n$ of the N-side solar cell module 20. Since Equation (1) is based on the assumption that the output voltages of the solar cell modules 20 are the same, the actual measured value will deviate from the ideal value obtained based on Equation (1) above.

Referring to FIG. 4, it can be understood that the increase amount $\Delta V$ of the output voltage $V_p$ with respect to the output voltage $V_n$ increases as the output voltage $V_n$ decreases. As a result, it can be understood that as the power supply voltage $V_{PV}$ decreases, the error of the measured value with respect to the ideal value increases.

Also, when the ground fault point voltage ($V_{PV} \times X$) is a certain value, if the ground fault resistance $R_g$ is small, the size (absolute value) of the ground fault current $I_g$ increases. Referring to FIG. 4, it can be understood that the increase amount $\Delta V$ increases as the absolute value of the ground fault current $I_g$ is large. As a result, it can be understood that when the ground fault resistance $R_g$ is small, the absolute value of the ground fault current $I_g$ increases and the error above further increases.

Example 1

Therefore, in the present embodiment, the ground fault position calculation part 41 sets the lower limit value of the power supply voltage $V_{PV}$ used for determining the ground fault position $P_g$. Accordingly, the ground fault position calculation part 41 obtains the ground fault position $P_g$ by using the power supply voltage $V_{PV}$ equal to or higher than the lower limit value, so that the error of the actual measured value with respect to the ideal value can be suppressed. As a result, the error of the ground fault position $P_g$ can be suppressed.

Examples of setting the lower limit value are as follows.

(Setting Example 1 of the Lower Limit Value)

For example, a value obtained by multiplying the open circuit voltage by a predetermined ratio (for example, 60%) may be set as the lower limit value. The open circuit voltage is the power supply voltage $V_{PV}$ in a state (open state) in which no current flows from the solar cell string 11 and can be easily measured. Therefore, the lower limit value can be easily set.

(Setting Example 2 of the Lower Limit Value)

For example, the power supply voltage $V_{PV}$ at the maximum output point may be set as the lower limit value. Normally, in the solar power generation system 1, MPPT (maximum power point tracking) control that tracks the maximum output point is performed. In this case, the power supply voltage $V_{PV}$ at the time when the ground fault determination part 40 determines that a ground fault exists is the power supply voltage $V_{PV}$ at the maximum output point. Therefore, the power supply voltage $V_{PV}$ at the time when it is determined that the ground fault exists is set as the lower limit value, and the lower limit value can be easily set.

(Setting Example 3 of the Lower Limit Value)

For example, the minimum value in the range in which the linearity of the power supply voltage $V_{PV}$ and the ground fault current $I_g$ or the ground fault point voltage ($V_{PV} \times X$) is maintained may be set as the lower limit value. Specifically, the ground fault current $I_g$ or the ground fault potential $V_g$ is measured with respect to three or more power supply voltages $V_{PV}$ different from each other. The region where the change amount of the ground fault current $I_g$ or the ground fault potential $V_g$ with respect to the change amount of the power supply voltage $V_{PV}$ is constant is the region where the linearity is maintained.

For example, it is assumed that four measurement points indicating "90%" are obtained in FIG. 2A. In this case, since the range in which the linearity (the gradient of the graph) is maintained is 140 V to 250 V, the lower limit value is 140 V. Further, it is assumed that four measurement points indicating "50%" are obtained in FIG. 2B. In this case, since the range in which the linearity is maintained is 220 V to 250 V, the lower limit value is 220 V.

It is desirable to set the three or more power supply voltages $V_{PV}$ above such that the condition that the change amount of the current of the solar cell string 11 with respect to the change amount of the power supply voltage $V_{PV}$ is larger than that of the ground fault current $I_g$ is satisfied. Alternatively, from the measurement data including a plurality of different power supply voltages $V_{PV}$, three or more power supply voltages $V_{PV}$ that satisfy the condition above may be selected and the ground fault current $I_g$ or the ground fault potential $V_g$ corresponding to each of the selected power supply voltages $V_{PV}$ may be extracted from the measurement data.

Example 2

In another example, the ground fault position calculation part 41 outputs information on the range of an error of an estimated value corresponding to the estimated value of the ground fault position $P_g$ calculated by using Equation (1) above. In addition, the ground fault position calculation part 41 may output the information on the estimated value and the range.

Examples of the information above include the range of the error of X, the information of the solar cell module 20 included in the range, and the like. Examples of the output include display, printing, communication, and the like. For example, it is possible to display and output 30% to 60% as X above. A plurality of blocks indicating the plurality of solar cell modules 20 included in the solar cell string 11 are displayed, and warning display of a block indicating the solar cell module 20 included in the range above is performed with red color.

Thus, the user can grasp the rough position where the ground fault occurs. As a result, it is possible to reduce the risk of mistaking the solar cell module 20 to be repaired or causing electric shock resulting from accidentally touching the solar cell module 20 which is grounded.

The range above can be obtained from the graphs shown in FIG. 2A, FIG. 2B, FIG. 3A and FIG. 3B. Further, the graphs shown in FIG. 2A, FIG. 2B, FIG. 3A and FIG. 3B can be created according to the I-V characteristic of the solar cell string 11.

Therefore, if the characteristic of the solar cell string 11 does not change much, the ground fault position calculation part 41 can store in the storage part 36 a first table in which the estimated value and the range of the ground fault position $P_g$ are associated with each other in advance. The ground fault position calculation part 41 can obtain the range above corresponding to the estimated value of the calculated ground fault position $P_g$ with reference to the first table and output the information on the range.

Also, the control part 35 detects the I-V characteristic of the solar cell string 11 by controlling the power supply voltage $V_{PV}$ of the solar cell string 11. Alternatively, while the solar power generation system 1 is operating, the I-V characteristic may be detected by monitoring the power supply voltage $V_{PV}$ and the current of the solar cell string 11. The ground fault position calculation part 41 creates a second table showing the graphs of FIG. 2A, FIG. 2B, FIG. 3A and FIG. 3B and creates the first table from the second table based on the I-V characteristic and stores them in the storage part 36. For example, referring to the graphs of FIG. 2A, FIG. 2B, FIG. 3A and FIG. 3B, a straight line of a plurality of actual measured values having the same gradient as the straight line of the ideal values corresponding to a certain ground fault position $P_g$ can be selected, and the range of the ground fault position $P_g$ corresponding to the straight line of the selected plurality of actual measured values can be obtained. Therefore, it is possible to create the first table from the second table. Then, the ground fault position calculation part 41 can take the calculated estimated value as the ideal value of the ground fault position $P_g$, obtain the range corresponding to the ideal value by referring to the first table, and output the information on the range.

Although the range above is determined based on the variation ($\Delta V$ shown in FIG. 4) of the output voltage of the plurality of solar cell modules 20 in the solar cell string 11, the range may also be determined in consideration of the variation based on the sensor characteristic associated with the current sensor and the voltage sensor provided in the input side measurement circuit 33.

Example 3

Also, in another example, the ground fault position calculation part 41 creates a third table (correspondence information) in which the power supply voltage $V_{PV}$ and the ground fault current $I_g$ are associated with each other for each of the ground fault resistance $R_g$ and the ground fault position $P_g$ based on the I-V characteristic of the solar cell string 11 detected by the control part 35 as described above, and uses the third table for fitting of a plurality of different power supply voltages $V_{PV}$ and a plurality of ground fault currents $I_g$ respectively measured based on the plurality of power supply voltages $V_{PV}$, so as to obtain the ground fault resistance $R_g$ and the ground fault position $P_g$. In this case, it is possible to accurately obtain the ground fault resistance $R_g$ and the ground fault position $P_g$.

Embodiment 2

Another embodiment of the disclosure will now be described with reference to FIG. 5.

Figure 5:
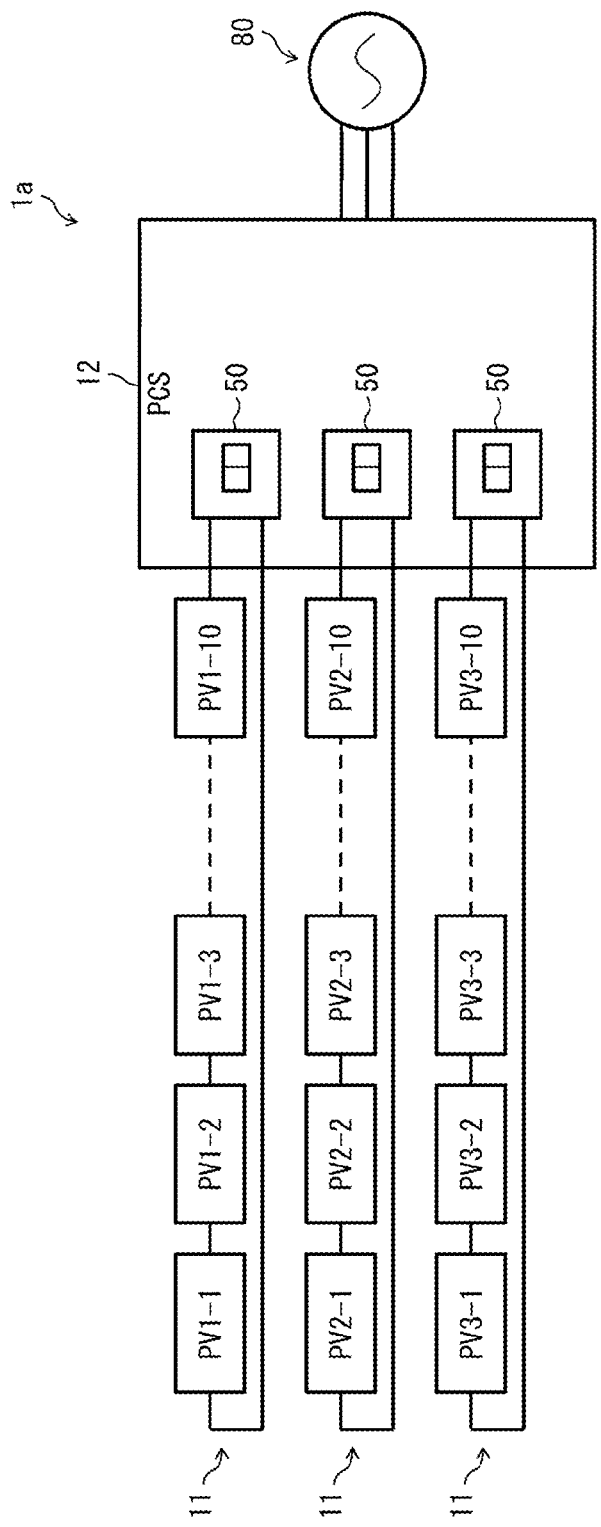
FIG. 5 is a block diagram showing an example of a schematic configuration of a solar power generation system according to another embodiment of the disclosure.

FIG. 5 is a block diagram showing an example of a schematic configuration of a solar power generation system 1a according to the present embodiment. The solar power generation system 1a shown in FIG. 5 differs from the solar power generation system 1 shown in FIG. 1 in that each of the three solar cell strings 11 is connected in parallel to the PCS 12 via a DC breaker 50, and the rest of the configuration is the same. Since the DC breaker 50 has a known configuration, a detailed description thereof will be omitted.

Even in the solar power generation system 1a of the present embodiment, as in the solar power generation system 1 shown in FIG. 1, the ground fault position calculation part 41 can estimate the ground fault position $P_g$ by measuring the power supply voltage $V_{PV}$ and the ground fault current $I_g$. As a result, it is possible to improve the efficiency of the recovery work on site.

Next, in the present embodiment, the ground fault determination part 40 of the PCS 12 determines a ground fault with one of the three DC breakers 50 being turned on (conducting state) and the others being turned off (open state), which is repeated for each of the three DC breakers 50. As a result, it is possible to identify the solar cell string 11 in which the ground fault occurs. Therefore, since the ground fault position $P_g$ is estimated and the solar cell string 11 in which the ground fault has occurred is specified, it is possible to further improve the efficiency of the recovery work on site.

It should be noted that the ground fault position calculation part 41 may estimate the ground fault position $P_g$ after turning on only the DC breaker 50 corresponding to the specified solar cell string 11 and turning off the others. In this case, it is possible to individually estimate a plurality of ground fault positions $P_g$ in the plurality of solar cell strings 11 in which ground faults have occurred.

A solar power generation system in which a plurality of solar cell strings are connected in parallel in a junction box and then connected to a PCS is also known. A solar power generation system in which a plurality of DC breakers are provided in the junction box above and each of the plurality of solar cell strings is connected in parallel via the DC breaker is also known. In such a solar power generation system, by providing the ground fault determination part 40 and the ground fault position calculation part 41 in the PCS 12 of the solar power generation system 1a according to the present embodiment, it is possible to realize the above operational effects of the present embodiment.

Embodiment 3

A further alternative embodiment of the disclosure will now be described with reference to FIG. 6.

Figure 6:
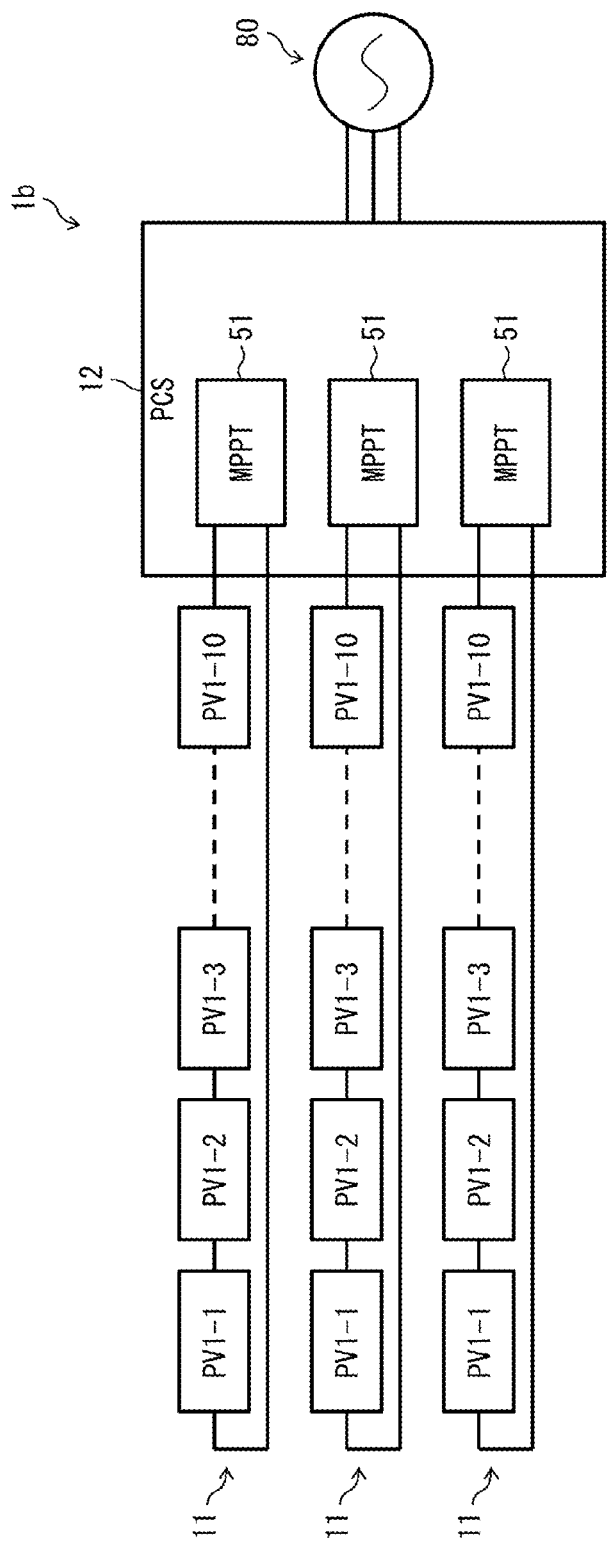
FIG. 6 is a block diagram showing an example of a schematic configuration of a solar power generation system according to still another embodiment of the disclosure.

FIG. 6 is a block diagram showing an example of a schematic configuration of a solar power generation system 1b according to the present embodiment. The solar power generation system 1b shown in FIG. 6 differs from the solar power generation system 1a shown in FIG. 5 in that MPPT control devices 51 are provided instead of the DC breakers 50, and the rest of the configuration is the same.

The MPPT control device 51 controls the power supply voltage $V_{PV}$ of the solar cell string 11 so as to track the maximum output point of the solar cell string 11. Since the MPPT control device 51 has a known configuration, a detailed description thereof will be omitted. In the present embodiment, a plurality of solar cell strings 11 are provided with a plurality of MPPT control devices 51, respectively. As a result, the plurality of MPPT control devices 51 can control the power supply voltage $V_{PV}$ of the plurality of solar cell strings 11, respectively.

Therefore, in the present embodiment, the control part 35 of the PCS 12 instructs one of the three MPPT control devices 51 to temporarily stop the MPPT control to change the power supply voltage $V_{PV}$, which is repeated for each of the three MPPT control devices 51. As a result, the ground fault determination part 40 can specify the solar cell string 11 corresponding to the MPPT control device 51 in which the ground fault current $I_g$ has changed when the power supply voltage $V_{PV}$ is changed as the solar cell string 11 in which a ground fault occurs. Therefore, even when ground faults occur in a plurality of solar cell strings 11, it is possible to identify the plurality of solar cell strings 11.

Moreover, the ground fault position calculation part 41 can estimate the ground fault position $P_g$ in the solar cell string 11 in which the ground fault occurs based on the relationship between the change of the power supply voltage $V_{PV}$ and the change of the ground fault current $I_g$. Therefore, since the solar cell string 11 in which the ground fault has occurred is specified and the ground fault position $P_g$ in the solar cell string 11 is estimated, it is possible to improve the efficiency of the recovery work on site.

In the solar power generation systems 1a and 1b shown in FIG. 5 and FIG. 6, three solar cell strings 11 are used, but the disclosure is not limited thereto. Two solar cell strings 11 may also be used, or four or more solar cell strings 11 may also be used.

Embodiment 4

Another embodiment of the disclosure will now be described with reference to FIG. 7.

Figure 7:
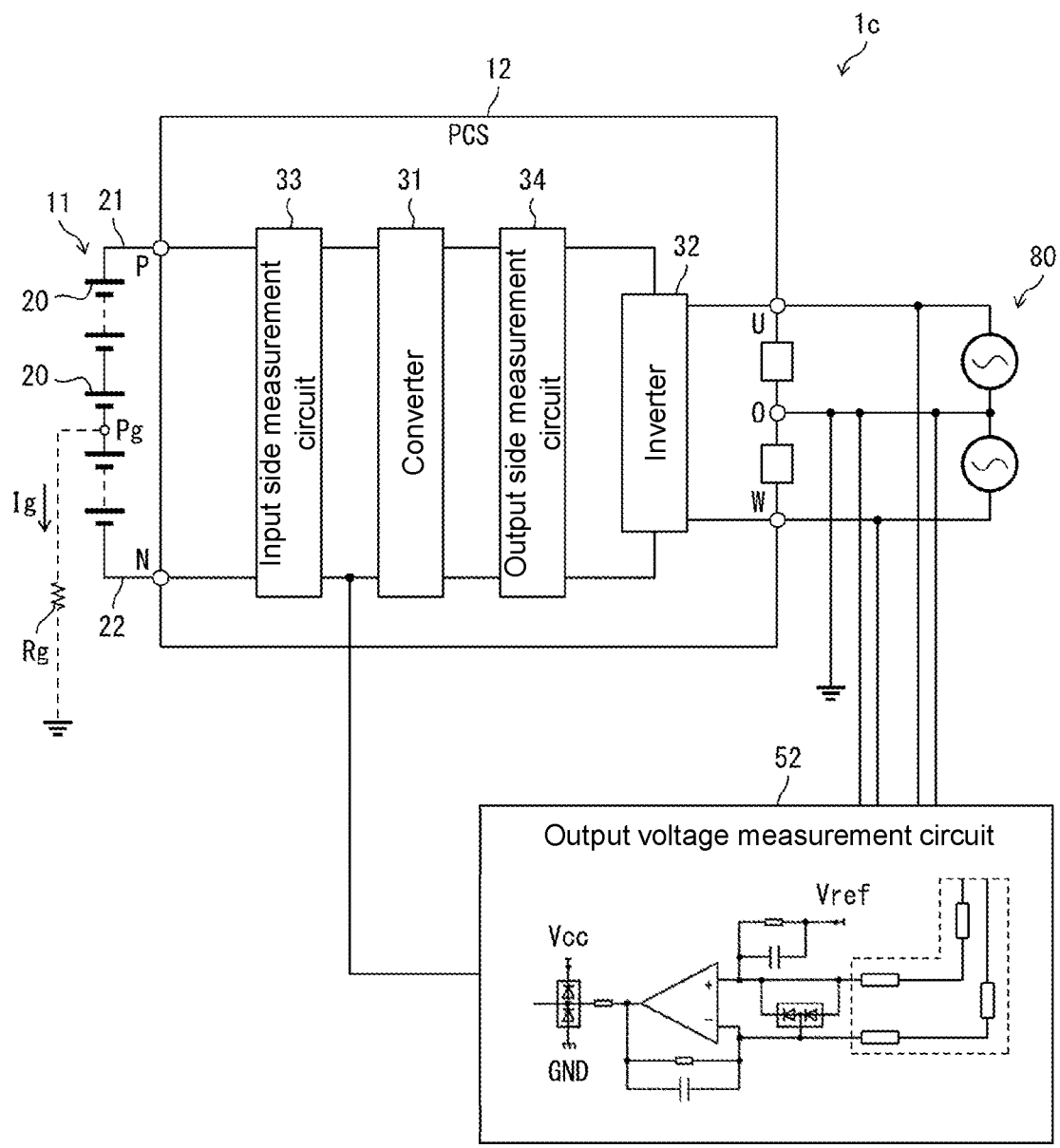
FIG. 7 is a block diagram showing an example of a schematic configuration of a solar power generation system according to another embodiment of the disclosure.

FIG. 7 is a block diagram showing an example of a schematic configuration of a solar power generation system 1c according to the present embodiment. The solar power generation system 1c shown in FIG. 7 differs from the solar power generation system 1 shown in FIG. 1 in that an output voltage measurement circuit 52 for measuring the voltage output to the power system 80 is newly provided, and the rest of the configuration is the same. In FIG. 7, the illustration of the control part 35 and the storage part 36 in the PCS 12 is omitted for simplicity.

There is a possibility that a minute current may flow from the output voltage measurement circuit 52 to the PCS 12 as shown in FIG. 7. Therefore, if a ground fault occurs in the solar cell string 11, a current flows from the output voltage measurement circuit 52 to the ground fault position $P_g$, and the determination of the ground fault position $P_g$ may be affected as a result. However, based on the circuit constant, the voltage value, and the current value in the power system 80, the current flowing in the output voltage measurement circuit 52 can be calculated, and as a result, the specified ground fault position $P_g$ can be corrected.

Alternatively, the output voltage measurement circuit 52 may be an insulation circuit. In this case, it is possible to prevent the current from flowing from the output voltage measurement circuit 52 to the ground fault position $P_g$, thereby preventing the influence on the specification of the ground fault position $P_g$. Although the output voltage measurement circuit 52 is described in the example of FIG. 7, the same applies to other measurement circuits provided in the power system 80.

[Implementation Example by Software]

The control block (particularly the control part 35) of the PCS 12 may be realized by a logic circuit (hardware) formed in an integrated circuit (IC chip) and the like or may be realized by software.

In the latter case, the PCS 12 includes a computer that executes instructions of a program, which is software that realizes each function. The computer includes, for example, one or more processors and includes a computer readable recording medium storing the program. In the computer, the disclosure is achieved by the processor which reads the program from the recording medium and executes the program. As the processor, for example, a CPU (central processing unit) can be used. As the recording medium, in addition to "a non-transitory tangible medium" such as a ROM (read only memory), a tape, a disk, a card, a semiconductor memory, a programmable logic circuit, and the like can be used. Further, a RAM (random access memory) and the like may be further included for developing the program above. Further, the program may be supplied to the computer via any transmission medium (a communication network, a broadcast wave, and the like) capable of transmitting the program. It is noted that one or some embodiments of the disclosure can also be realized in the form of a data signal embedded in a carrier wave in which the program is embodied by electronic transmission.

ADDITIONAL NOTES

In the embodiments above, the ground potential of the input terminal N is obtained based on the converted voltage $V_{DDC}$ of the converter 31 through the grounding of the power system 80, but the disclosure is not limited thereto. In the PCS 12, by grounding the position where the ground potential does not change even if the power supply voltage $V_{PV}$ of the solar cell string 11 is changed, and measuring the ground fault current $I_g$ by changing the power supply voltage $V_{PV}$ above, the ground fault position $P_g$ can be obtained.

In the embodiments above, the ground fault determination part 40 and the ground fault position calculation part 41 are provided in the PCS 12, but they may also be provided in an external device capable of communicating with the PCS 12.

The disclosure is not limited to the embodiments described above, and various modifications are possible within the scope defined by the claims. Any embodiments obtained by appropriately combining the technical means respectively disclosed in different embodiments also fall in the technical scope of the disclosure.

What is claimed is:

1. A ground fault detection device adapted for a solar power generation system comprising a solar cell string in which a plurality of solar cell modules are connected in series and a power conversion device for converting power supplied from the solar cell string and outputting the converted power to a system, the ground fault detection device comprising:

a ground fault position specifying part for specifying a ground fault position by using an output voltage of the solar cell string, a ground fault current, and a ground potential measured by the power conversion device, wherein the ground fault position is between the $k^{th}$ solar cell module and $(k+1)^{th}$ solar cell module, where $1 \leq k \leq n-1$, n is the number of the solar cell modules, $X=k/n$, and X is a value indicating the ground fault position, wherein the ground fault position specifying part sets a lower limit value of the output voltage to be used.

2. The ground fault detection device according to claim 1, wherein the lower limit value is a value obtained by multiplying an open circuit voltage of the solar cell string by a predetermined ratio.

3. The ground fault detection device according to claim 1, wherein the lower limit value is the output voltage at a maximum output point of the solar cell string.

4. The ground fault detection device according to claim 1, wherein the lower limit value is a minimum value in a range in which linearity of the output voltage and the ground fault current is maintained.

5. A ground fault detection device adapted for a solar power generation system comprising a solar cell string in which a plurality of solar cell modules are connected in series and a power conversion device for converting power supplied from the solar cell string and outputting the converted power to a system, the ground fault detection device comprising:

a ground fault position specifying part for specifying a ground fault position by using an output voltage of the solar cell string, a ground fault current, and a ground potential measured by the power conversion device, wherein the ground fault position specifying part outputs information on a range of an error of the ground fault position corresponding to the specified ground fault position.

6. A ground fault detection device adapted for a solar power generation system comprising a solar cell string in which a plurality of solar cell modules are connected in series and a power conversion device for converting power supplied from the solar cell string and outputting the converted power to a system, the ground fault detection device comprising:

a ground fault position specifying part for specifying a ground fault position by using an output voltage of the solar cell string, a ground fault current, and a ground potential measured by the power conversion device, wherein the ground fault position is between the $k^{th}$ solar cell module and $(k+1)^{th}$ solar cell module, where $1 \leq k \leq n-1$, n is the number of the solar cell modules, $X=k/n$, and X is a value indicating the ground fault position, wherein the ground fault position specifying part obtains an I-V characteristic of the solar cell string from the power conversion device, creates corresponding information of the output voltage and the ground fault current for the ground fault position by using the obtained I-V characteristic, and specifies the ground fault position corresponding to the output voltage and the ground fault current obtained from the power conversion device based on the created corresponding information.

* * * * *